United States Patent
Yamanaka et al.

(10) Patent No.: US 9,585,293 B2
(45) Date of Patent: Feb. 28, 2017

(54) POWER CONVERSION APPARATUS

(71) Applicant: KABUSHIKI KAISHA YASKAWA DENKI, Kitakyushu-shi (JP)

(72) Inventors: Yasunori Yamanaka, Kitakyushu (JP); Masafumi Sakai, Kitakyushu (JP); Kenshiro Morishita, Kitakyushu (JP); Kazunori Nonoyama, Kitakyushu (JP); Yuichi Sakaguchi, Kitakyushu (JP)

(73) Assignee: Kabushiki Kaisha Yaskawa Denki, Kitakyushu-Shi (JP)

( * ) Notice: Subject to any disclaimer, the term of this patent is extended or adjusted under 35 U.S.C. 154(b) by 0 days.

(21) Appl. No.: 14/800,702

(22) Filed: Jul. 16, 2015

(65) Prior Publication Data

US 2016/0037677 A1    Feb. 4, 2016

(30) Foreign Application Priority Data

Jul. 29, 2014    (JP) .................................. 2014-154147

(51) Int. Cl.
*H05K 7/20* (2006.01)

(52) U.S. Cl.
CPC ................................ *H05K 7/20918* (2013.01)

(58) Field of Classification Search
CPC .............. H01L 2023/405; H05K 7/209; H05K 7/20918; G06F 1/20
See application file for complete search history.

(56) References Cited

U.S. PATENT DOCUMENTS

| | | | |
|---|---|---|---|
| 8,462,505 B2* | 6/2013 | Nagami | B23K 9/1006 165/104.33 |
| 8,619,424 B2* | 12/2013 | Kishimoto | H05K 7/20909 165/104.33 |
| 9,433,123 B2* | 8/2016 | Schroedl | H05K 7/20127 |
| 2012/0262969 A1* | 10/2012 | Nagano | H05K 7/20909 363/141 |

(Continued)

FOREIGN PATENT DOCUMENTS

| JP | 08-65825 | 3/1996 |
|---|---|---|
| JP | 09-322334 | 12/1997 |

(Continued)

OTHER PUBLICATIONS

Japanese Office Action for corresponding JP Application No. 2014-154147, Sep. 16, 2016 (w/ English machine translation).

(Continued)

*Primary Examiner* — Robert J Hoffberg
*Assistant Examiner* — Hung Dang
(74) *Attorney, Agent, or Firm* — Mori & Ward, LLP

(57) ABSTRACT

An inverter includes: a housing base which includes a front area and a rear area opposite to the front area; a main body which is arranged in the front area of the housing base and houses a plurality of electronic components forming a power conversion circuit; a first duct which is arranged in the rear area of the housing base and includes a first end connected to an intake port of cooling air; a first heat sink which is arranged in the rear area of the housing base and includes a first fin and a first heat sink base extending perpendicular to an extension direction of the first duct; and a reactor which is arranged in the heat sink base in the rear area of the housing base, and generates heat at the time of energization.

16 Claims, 7 Drawing Sheets

(56) References Cited

U.S. PATENT DOCUMENTS

2013/0170270 A1* 7/2013 Yamanaka ........... H05K 7/1432
363/146
2013/0308275 A1* 11/2013 Yamanaka ........... H05K 7/2039
361/717

FOREIGN PATENT DOCUMENTS

| JP | 11-307703 | 11/1999 |
| --- | --- | --- |
| JP | 2006-210605 | 8/2006 |
| JP | 2008-078423 | 4/2008 |
| JP | 2012-228019 | 11/2012 |

OTHER PUBLICATIONS

Japanese Office Action for corresponding JP Application No. 2014-154147, Dec. 15, 2016 (w/ English machine translation).

* cited by examiner

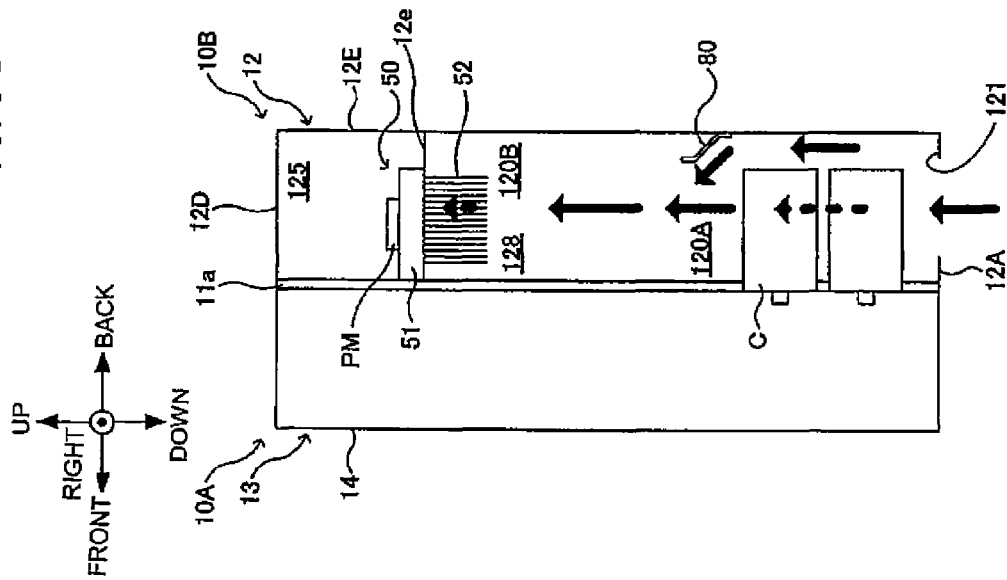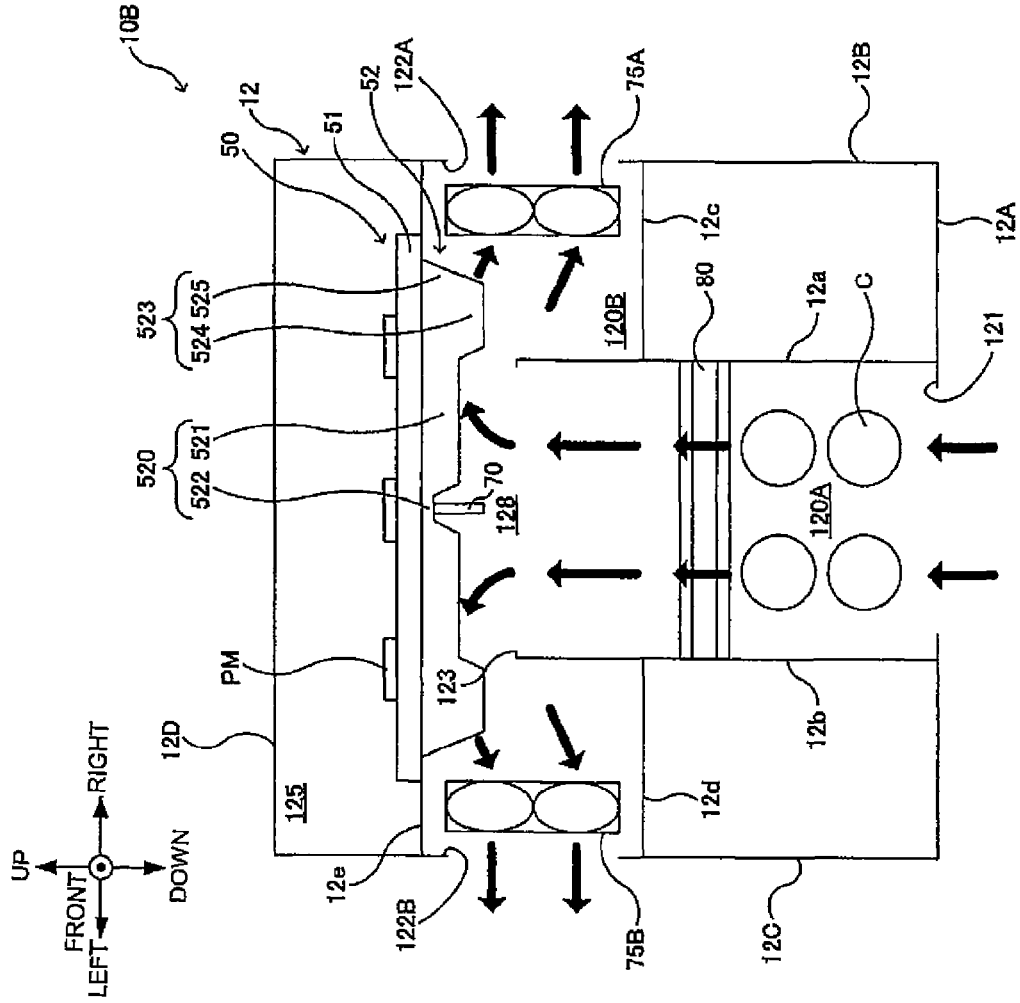

POWER CONVERSION APPARATUS

INCORPORATION BY REFERENCE

The present disclosure contains subject matter related to that disclosed in Japanese Priority Patent Application JP 2014-154147 filed in the Japan Patent Office on Jul. 29, 2014, the entire contents of which are hereby incorporated by reference.

BACKGROUND

Technical Field

An embodiment of this disclosure relates to a power conversion apparatus.

Related Art

JP 2012-228019 A describes a power converting apparatus including a main body which has a plurality of electronic components and an air duct portion through which cooling air flows.

In the above-described power converting apparatus, the configuration of the apparatus needs to be further optimized in order to achieve further improvement in a cooling efficiency.

The embodiment has been made in view of such a problem, and the object thereof is to provide a power conversion apparatus capable of improving the cooling efficiency.

SUMMARY

An aspect of the embodiment is summarized as a power conversion apparatus including: a housing base which includes a first area and a second area opposite to the first area; a main body which is arranged in the first area of the housing base and houses a plurality of electronic components forming a power conversion circuit; a first duct which is arranged in the second area of the housing base and includes a first fin and a first end connected to an intake port of cooling air; a first heat sink which is arranged at the second area of the housing base and includes a first fin and a first heat sink base extending perpendicular to an extension direction of the first duct; and a first heat generating component which is installed on the first heat sink base in the second area of the housing base, and generates heat at the time of energization.

An aspect of the embodiment is summarized as a power conversion apparatus including: a housing base which includes a first area and a second area opposite to the first area; a main body which is arranged in the first area of the housing base and houses a plurality of electronic components forming a power conversion circuit; a first duct which is arranged in the second area of the housing base and includes a first end connected to an intake port of cooling air; a first heat sink which includes a first fin and a first heat sink base and is arranged in the second area of the housing base such that a plate surface direction of the first heat sink base is perpendicular to an extension direction of the first duct; and a first heat generating component which is installed on the first heat sink base in the second area of the housing base, and generates heat at the time of energization.

An aspect of the embodiment is summarized as a power conversion apparatus including: a housing base which includes a first area and a second area opposite to the first area; a main body which is arranged in the first area of the housing base and houses a plurality of electronic components forming a power conversion circuit; a duct which is arranged in the second area of the housing base and includes an end connected to an intake port of cooling air; a heat sink which includes a heat sink base; a heat generating component which is installed on the heat sink base at the second side of the housing base, and generates heat at the time of energization; and means for making the cooling air contact with the heat sink along a direction perpendicular to a direction to which the heat sink base extends.

BRIEF DESCRIPTION OF DRAWINGS

FIGS. 6A and 6B are a plan view and a side cross-sectional view schematically illustrating an example of arrangement configuration of each constituent element of an inverter according to a modification in which a power module is installed on a first heat sink.

DETAILED DESCRIPTION

Figure 1:
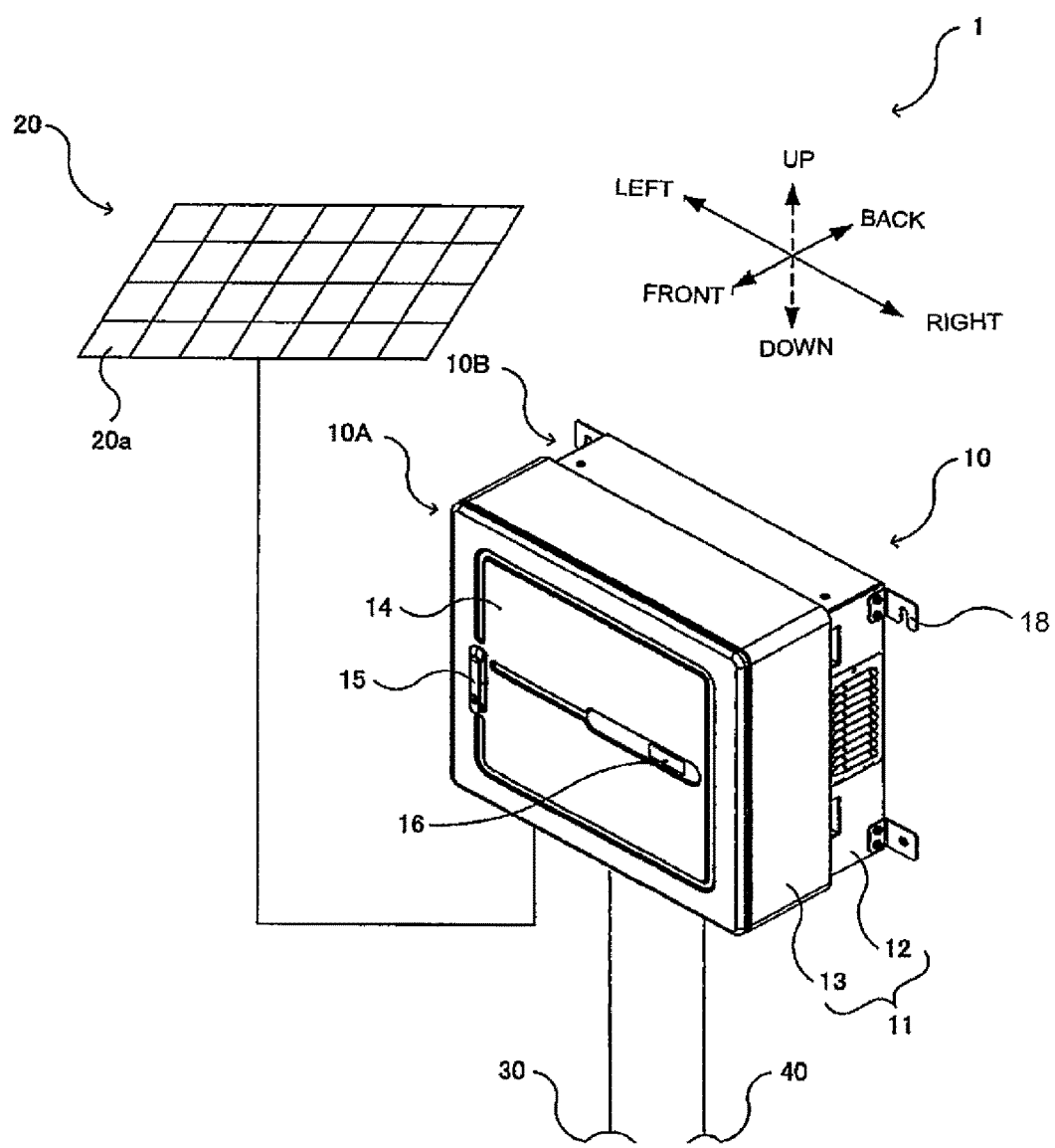
FIG. 1 is a system configuration diagram illustrating an example of the entire configuration of a power conversion system according to one embodiment.

Hereinafter, an embodiment will be described with reference to the drawings. Incidentally, the same constituent element practically having the same function is indicated by the same reference numeral as a principle, and the redundant description thereof will be appropriately omitted in the specification and drawing. In addition, each direction of "front", "rear", "left", "right", "upper" and "lower", noted in the drawings, corresponds to each direction of "front", "rear", "left", "right", "upper" and "lower" to be described in this description. However, the positional relationship of each configuration of a power conversion apparatus according to one embodiment is not limited to the concept of "front", "rear", "left", "right", "upper" and "lower".

<1. Entire Configuration of Power Conversion System>

First, a description will be made regarding an example of the entire configuration of a power conversion system according to an embodiment with reference to FIG. 1.

As illustrated in FIG. 1, a power conversion system 1 includes an inverter (DC-AC converter) 10 as an example of a power conversion apparatus, and a solar cell array 20 as an example of an external apparatus to be connected to the inverter 10.

The solar cell array 20 directly converts an optical energy generated by sun light to DC power, and supplies the DC power to the inverter 10. The solar cell array 20 is configured by arranging a plurality of solar cell panels (solar cell modules) 20a which is configured by arranging a plurality of solar cells, connected to one another, in a panel shape, and for example, is installed on, for example, a rooftop of a building or the like. Further, the solar cell array 20 has one or more strings, the string formed by blocks of a plurality of solar cell panels 20a which are connected in series. The solar cell array is connected to the inverter 10 for each string, and supplies DC power to the inverter 10 for each string.

Incidentally, although the description is made regarding the case where the solar cell array 20 is used as the external apparatus in the embodiment, any apparatus capable of supplying power to the power conversion apparatus may be employed as the external apparatus, and another external apparatus other than the solar cell array 20 may be used. For example, a battery such as a fuel cell, a generator such as a wind power generator, or the like may be used as the external apparatus.

The inverter 10 converts the DC power input from the solar cell array 20 for each string to a predetermined AC power (for example, single-phase AC power) and outputs the AC power to the system power supply 30. In addition, a terminal serving a power supply connection of an electric appliance 40 (not illustrated) is provided to the inverter 10. The AC power may be output from the inverter 10 to the electric appliance 40 by connecting the electric appliance 40 through the terminal.

The inverter 10 includes a housing base 11a (see FIG. 4B to be described hereinafter) which includes a front side as an example of a first area and a rear area as an example of a second area, a main body 10A arranged at the front side of the housing base 11a, and an air duct portion 10B arranged at the rear side of the housing base 11a. Hereinafter, the front area is opposite to the second area. Incidentally, each positional relationship of the main body 10A and the air duct portion 10B with respect to the housing base 11a may be opposite to the above description. The main body 10A includes a plurality of electronic components (details will be described hereinafter) forming a power conversion circuit, and a main body case 13 housing the plurality of electronic components or the like. The air duct portion 10B includes a duct 120 (see FIG. 2 to be described hereinafter) forming an air duct through which cooling air flows, and a duct case 12 housing the duct 120 or the like. In the embodiment, each of the duct case 12 and the main body case 13 has substantially a rectangular parallelepiped shape, but may have another shape. In other words, the duct case 12 and the main body case 13 form the housing 11. Incidentally, the housing 11 may be configured by one case.

An attachment bracket 18 for attaching the inverter 10 to a wall surface (not illustrated) is provided, for example, in the vicinity of four outer corners of the duct case 12. Incidentally, in each drawing other than FIG. 1, the attachment bracket 18 is not illustrated.

A faceplate 14 that may be opened and closed, and covers the plurality of electronic components arranged inside the main body case 13 in a closed state is provided to the main body case 13. A handle 15 to perform the opening and closing operation of the faceplate 14 and a display portion 16 to perform various kinds of display are provided to the faceplate 14.

Incidentally, although the description is made regarding the case where the inverter 10 is used as the power conversion apparatus in the embodiment, any apparatus capable of converting input power to a predetermined power may be employed as the power conversion apparatus, a power conversion apparatus other than the inverter 10 may be used. For example, an apparatus (AC-DC converter) converting AC power to DC power, an apparatus (DC-DC converter) converting DC power to another DC power, an apparatus (AC-AC converter) converting AC power to another AC power, and the like may be used as the power conversion apparatus.

Incidentally, the entire configuration of the power conversion system 1 described above is merely an example, and the configuration other than the above-described configuration may be employed.

<2. Arrangement Configuration of Each Constituent Element of Inverter>

Figure 2:
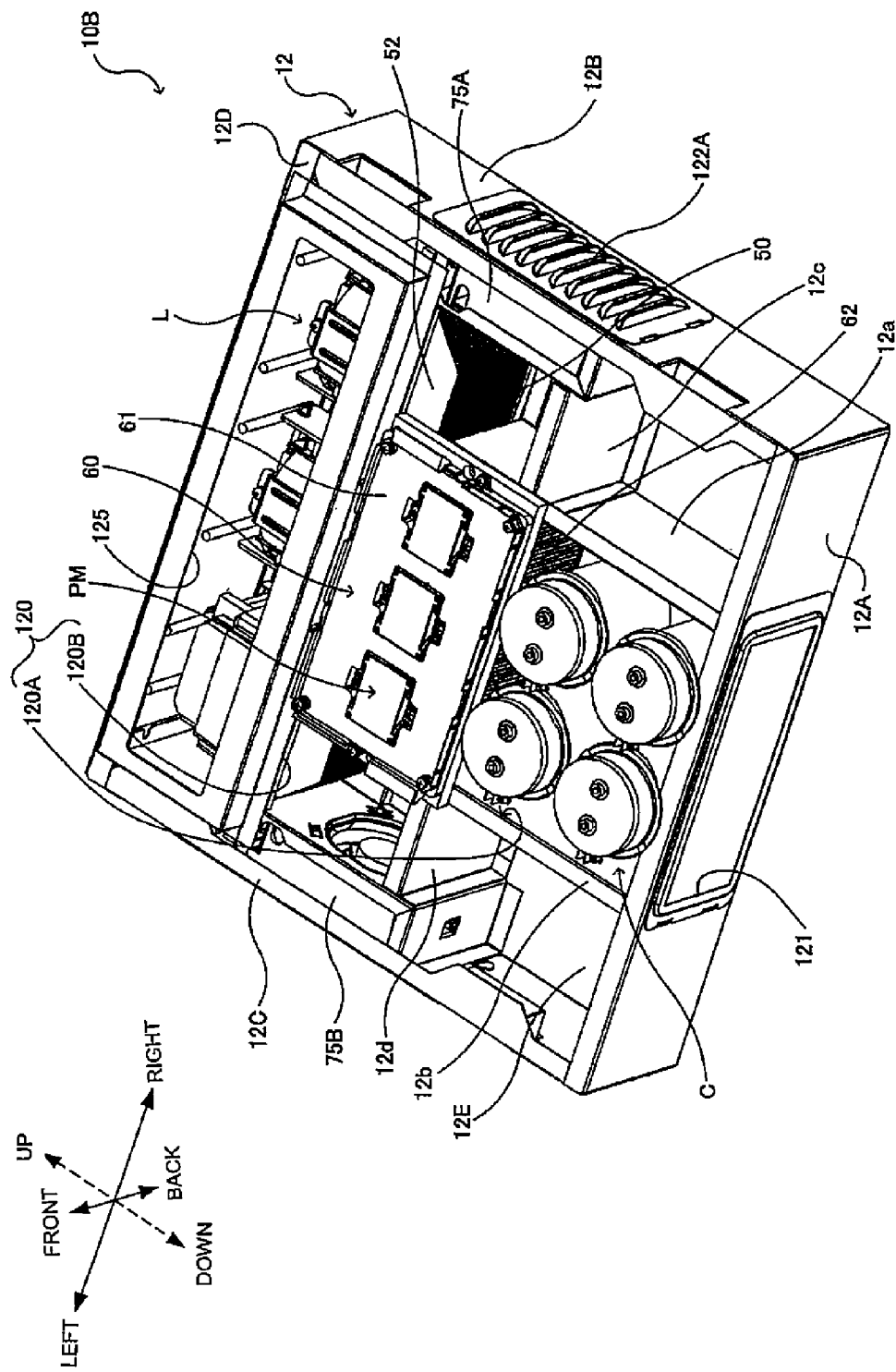
FIG. 2 is a perspective view illustrating an example of arrangement configuration of each constituent element of an inverter.

Next, a description will be made regarding an example of arrangement configuration of each constituent element of the inverter 10 with reference to FIGS. 2, 3, 4A and 4B. Incidentally, in FIG. 2, each configuration of the main body 10A except for the power module and the housing base 11a are not illustrated. In addition, in FIG. 3, a capacitor, a second heat sink, and the like are not illustrated from the configuration illustrated in FIG. 2. In addition, FIG. 4A is a plan view schematically illustrating the configuration illustrated in FIG. 2, and FIG. 4B is a side cross-sectional view of the configuration illustrated in FIG. 4A when viewed from the right direction. In FIGS. 4A and 4B, an example of a flow direction of the cooling air is schematically illustrated by a thick arrow.

In FIGS. 2, 3, 4A and 4B, as illustrated above, the inverter 10 includes the housing base 11a, the main body 10A and the air duct portion 10B. The main body 10A and the air duct portion 10B are partitioned and arranged, respectively, at a front side and a rear side of the housing base 11a (see FIG. 4A).

(2-1. Main Body)

The main body 10A includes the plurality of electronic components forming the power conversion circuit, and the main body case 13 in which the faceplate 14 is provided (see FIG. 4B), as described above.

Any electronic component forming a part of the power conversion circuit may be employed as the plurality of electronic components, and there is no particular limit in terms of types, number, presence or absence of heat generation at the time of energization, or the like. However, in the embodiment, a description will be made regarding a case in which, for example, three power modules PM as an example of a third heat generating component which generates heat at the time of energization are included among the plurality of electronic components. Incidentally, the power module PM may be housed in the duct case 12 in some cases.

Incidentally, in each drawing, the electronic components other than the power module PM housed in the main body case 13 are not illustrated.

The power module PM includes a switching element configured by a semiconductor element such as an insulated gate bipolar transistor (IGBT), and converts input power to a predetermined power and outputs the converted power.

(2-2. Air Duct Portion)

The air duct portion 10B includes the duct 120 and the duct case 12 as described above. Further, the air duct portion 10B includes a heat sink 50 (hereinafter, referred to as a "first heat sink 50") as an example of a first heat sink installed to the duct 120, and a reactor L as an example of a first heat generating component which generates heat at the time of energization.

(2-2-1. Intake Port and Exhaust Port)

The duct case 12 includes four-side outer peripheral walls 12A 12B, 12C and 12D and a bottom plate 12E, and a front side thereof is blocked by the housing base 11a.

An intake port 121 as an inlet at the time of suctioning the cooling air from the outside and two exhaust ports 122A and 122B (hereinafter, appropriately referred to as an "exhaust port 122", collectively) as an outlet at the time of discharging the cooling air to the outside are formed in the duct case 12. Incidentally, two or more intake ports 121 may be formed in the duct case 12, and only one exhaust port 122, or three or more exhaust ports 122 may be formed. In addition, in FIGS. 1 to 3, a case in which an exhaust port cover is provided to the exhaust port 122A is illustrated, however, the structure of the exhaust port cover is not limited to the illustrated example, and the exhaust port cover may not be provided. In addition, a filter or the like may be provided in the intake port 121.

In the embodiment, the intake port 121 is formed substantially at, for example, a center portion in a lateral direction of an outer peripheral wall 12A of a lower side of the duct case 12. Incidentally, the intake port 121 may be formed in the outer peripheral wall other than the lower side of the duct case 12. In addition, the exhaust port 122A is formed at, for example, an upper side than a center portion in a vertical direction of an outer peripheral wall 12B of a right side of the duct case 12, and the exhaust port 122B is formed at a position, which faces the exhaust port 122A of the outer peripheral wall 12B of the right side, in an outer peripheral wall 12C of a left side of the duct case 12. Incidentally, formation positions of the exhaust ports 122A and 122B in the duct case 12 may be positioned so as not to face each other. In addition, the exhaust ports 122A and 122B may be formed in the outer peripheral wall other than the right and left sides of the duct case 12.

Exhaust fans 75A and 75B (hereinafter, appropriately referred to as a "exhaust fan 75", collectively) for discharging the cooling air to the outside are installed, respectively, in the vicinity of the exhaust ports 122A and 122B inside the duct case 12. Incidentally, instead of installing the exhaust fan 75, an exhaust fan for suctioning the cooling air from the outside may be installed in the vicinity of the intake port 121 inside the duct case 12.

(2-2-2. Duct)

The duct 120 is configured by a first duct 120A and a second duct 120B. Incidentally, the duct 120 may be configured by only one duct or three or more ducts.

The first duct 120A is configured by a part of the housing base 11a, a part of the bottom plate 12E, and the partition walls 12a and 12b arranged therebetween, and both ends (a first end and a second end) thereof are opened. The first end (one end) of the first duct 120A is connected to the intake port 121 and extends in the vertical direction. In other words, the extension direction of the first duct 120A is the vertical direction. Incidentally, the extension direction of the first duct 120A is not limited to the vertical direction, and may be another direction. The partition walls 12a and 12b extend, respectively, from a right end portion and a left end portion of the intake port 121 to an upper side than a position in the vertical direction corresponding to lower end portions of the exhaust ports 122A and 122B, in the duct case 12. Accordingly, an opening 123 at the second end (another end) of the first duct 120A is positioned at the upper side of the position in the vertical direction corresponding to the lower end portions of the exhaust ports 122A and 122B. Hereinafter, the first end of the first duct 120A is a different end from the second end of the first duct 120A. Incidentally, the partition walls 12a and 12b may extend, respectively, to a position in the vertical direction corresponding to the lower end portions of the exhaust ports 122A and 122B.

The second duct 120B extends in a direction inclined with respect to the vertical direction, and is connected to the second end of the first duct 120A. In the embodiment, the second duct 120B extends in the lateral direction as an example of the direction inclined with respect to the vertical direction. In other words, the extension direction of the second duct 120B is the lateral direction. Incidentally, the second duct 120B may extend in a direction inclined with respect to the lateral direction, or the like. In addition, the second duct 120B is connected to the second end of the first duct 120A such that the second end of the first duct 120A is positioned at a middle position (for example, a center position) in the lateral direction thereof. The duct 120 is substantially a T shape in the plan view as a whole. Incidentally, the second duct 120B may be connected to the second end of the first duct 120A such that the second end of the first duct 120A is positioned at a left end side or right end side thereof.

The second duct 120B is configured by a part of the housing base 11a, a part of the bottom plate 12E and the partition walls 12c, 12d and 12e arranged therebetween, and both ends (a first end and a second end) thereof are opened. Further, both the ends of the second duct 120B are connected to the exhaust ports 122A and 122B. Incidentally, in a case where one exhaust port 122 is provided in the duct case 12 or the like, the first end (one end) of the second duct 120B may be connected to the exhaust port 122, and the second end (another end) of the second duct 120B may blocked. Hereinafter, the first end of the second duct 120B is opposite different end from the second end of the second duct 120B. The partition walls 12c and 12d extend in the lateral direction from the vicinity of each lower end portion of the exhaust ports 122B and 122A across each middle portion in the vertical direction of the partition walls 12b and 12a, in the duct case 12. The partition wall 12e extends in the lateral direction across the vicinity of a portion between each upper end portion of the exhaust ports 122A and 122B in the duct case 12.

(2-2-3. First Heat Sink and Reactor)

The first heat sink 50 includes a heat sink base 51 as an example of a first heat sink base, and a plurality of fins 52 as an example of a first fin. The fin 52 projects from a surface of one side of the heat sink base 51 to a direction perpendicular to a plate surface direction of the fin 52. The reactor L is installed to be positioned inside the duct case 12 on a surface of another side of the heat sink base 51. Further, the first heat sink 50 is installed in the duct case 12 such that the plurality of fins 52 is positioned inside the duct 120, and the plate surface direction of the heat sink base 51 is perpendicular to the vertical direction (in other words, the heat sink base 51 extends perpendicular to an extension direction of the first duct 120A). In other words, the plate surface direction of the heat sink base 51 is a surface direction perpendicular to the vertical direction, and the plurality of fins 52 projects in the vertical direction from the surface of the one side of the heat sink base 51. In other words, the projecting direction of the fin 52 is the vertical direction, and the plate surface direction of the fin 52 is a surface direction perpendicular to the longitudinal direction. Further, the first heat sink 50 is installed along the vertical direction in the duct case 12 at a position that the cooling air hits. In other words, the configuration of the first duct 120A and the first heat sink 50 which enables the cooling air to hit the first heat sink 50 along the vertical direction corresponds to an example of a unit for allowing cooling air to hit a heat sink along a direction perpendicular to a plate surface direction of a heat sink base.

Incidentally, any electronic component that generates heat at the time of energization may be employed as the heat generating component installed on the first heat sink 50, and there is no particular limit in terms of types, number, or the like. However, in the embodiment, a description will be made regarding a case where three reactors L, as an example of a coil-shaped component, are installed. Incidentally, a coil-shaped component (for example, a transformer or the like) other than the reactor L may be installed, or an electronic component (for example, the power module PM or the like) other than a coil shape may be installed. The reactor L is installed to have, for example, an axial direction of a winding to be the vertical direction, such that a protective cover for protecting the winding is for example, screwed on a surface of the another side of the heat sink base 51. Incidentally, the reactor L may be installed to have, for example, the axial direction of the winding to be the lateral direction, such that an end surface of the winding is in contact (directly or via a heat transfer plate) with the surface of the another side of the heat sink base 51.

The first heat sink 50 is installed in the second duct 120B, in the vicinity of a connection portion 128 between the second duct 1208 and the first duct 120A such that the plurality of fins 52 is positioned inside the second duct 120B, and the reactor L installed on the heat sink base 51 is positioned outside the second duct 120B.

To be more specific, a housing space 125 in which the reactor L is housed is formed outside, which is an upper side in this example, the second duct 120B in the duct case 12 by a part of the housing base 11a, a part of the bottom plate 12E, a part of the outer peripheral wall 12B of the right side, a part of the outer peripheral wall 12C of the left side, and the partition wall 12e. Incidentally, a position of the housing space 125 in the duct case 12 is not limited to the upper side of the second duct 120B, but may be another position. In addition, the housing space 125 may not be necessarily formed in the duct case 12. Further, the first heat sink 50 is installed on an upper surface of the partition wall 12e such that the plurality of fins 52 is positioned inside the second duct 120B, and the heat sink base 51 on which the reactor L is installed to block an opening of the partition wall 12e (not illustrated).

In addition, the plurality of fins 52 are classified to a portion 520 corresponding to the opening 123 of the first duct 120A (hereinafter, also referred to as an "opening corresponding portion 520"), and a portion 523 corresponding to an outer side of the opening 123 (hereinafter, also referred to as a "outer-opening corresponding portion 523").

The outer-opening corresponding portion 523 includes a portion 524 (hereinafter, also referred to as a "first non-opening corresponding portion 524") having a projection height higher than that of the opening corresponding portion 520 at the opening corresponding portion 520 side, and a portion 525 (hereinafter, also referred as a "second non-opening corresponding portion 525") having a varying projection height at an opposite side to the opening corresponding portion 520. In other words, an end portion of the outer-opening corresponding portion 523 at the opposite side to the opening corresponding portion 520 is inclined such that e projection height gradually decreases toward the end portion side. Incidentally, the outer-opening corresponding portion 523 may be formed to have the projection height higher than that of the opening corresponding portion 520 over the entire area. Instead, the outer-opening corresponding portion 523 may be formed to have the projection height equal to that of the opening corresponding portion 520, or may be formed to have the projection height lower than that of the opening corresponding portion 520.

The opening corresponding portion 520 is formed such that substantially a center portion 522 (hereinafter, also referred to as a "first opening corresponding portion 522") in the lateral direction thereof has a projection height lower than that of the other portion 521 (hereinafter, also referred to as a "second opening corresponding portion 521").

Incidentally, the opening corresponding portion 520 may be divided at substantially a center part in the lateral direction thereof. Instead, the opening corresponding portion 520 may be formed to have the equal projection height over the entire area. Further, a partition plate 70 is provided to overlap the fin 52 in the vertical direction in a position corresponding to the first opening corresponding portion 522 of the heat sink base 51 such that a plate surface direction thereof is perpendicular to the lateral direction, and divides the opening 123 of the first duct 120A into two parts. Incidentally, the installment position of the partition plate 70 may be any position at which the opening 123 of the first duct 120A in the second duct 120B may be divided into two parts, and is not limited to the position described above. In addition, the partition plate 70 may not be necessarily installed.

(2-2-4. Second Heat Sink)

In addition, a heat sink 60 (hereinafter, also referred to as a "second heat sink 60") as an example of the second heat sink is installed to the first duct 120A. Incidentally, in a case where the power module PM is provided to the air duct portion 10B for example, the second heat sink 60 may be installed to the first duct 120A. The second heat sink 60 includes a heat sink base 61 as an example of a second heat sink base, and a plurality of fins 62 as an example of a second fin. The fin 62 projects from a surface of the one side of the heat sink base 61 in a direction perpendicular to a plate surface direction thereof. Three power modules PM, for example, are installed on the a surface of the another side of the heat sink base 61 such that the power module PM is positioned inside the main body case 13. Further, the second heat sink 60 is installed to the first duct 120A such that the plurality of fins 62 is positioned inside the first duct 120A, the heat sink base 61 to which the power module PM is provided blocks an opening (not illustrated) of the housing base 11a and the plate surface direction of the heat sink base 61 is perpendicular to the longitudinal direction. At this time, the plate surface direction of the plurality of fin 62 is a surface direction perpendicular to the lateral direction.

Figure 3:
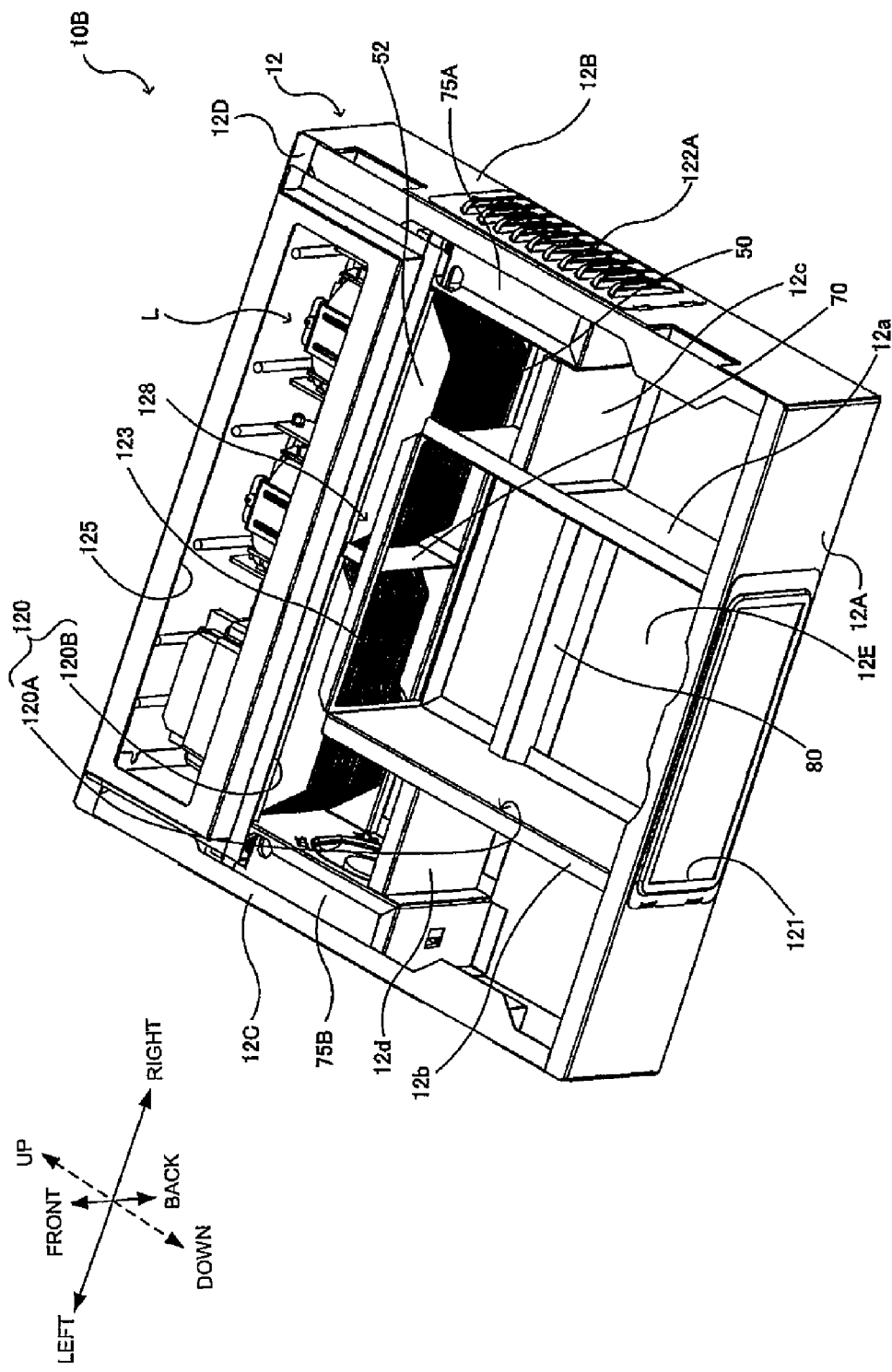
FIG. 3 is a perspective view illustrating an example of arrangement configuration of each constituent element of an inverter.
Figure 4B:
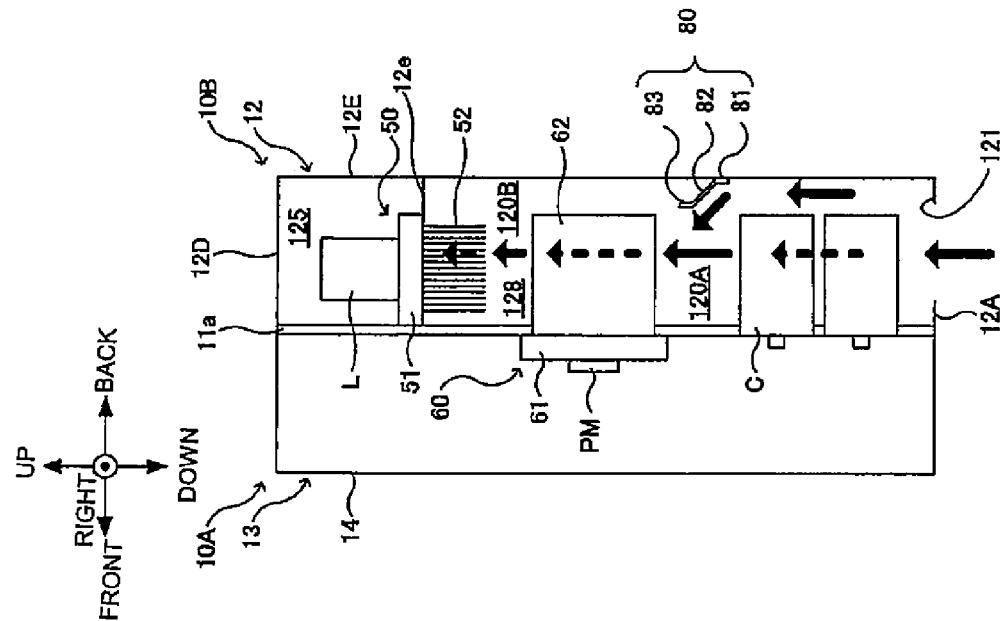
FIGS. 4A and 4B are a plan view and a side cross-sectional view illustrating an example of arrangement configuration of each constituent element of an inverter.
Figure 4A:
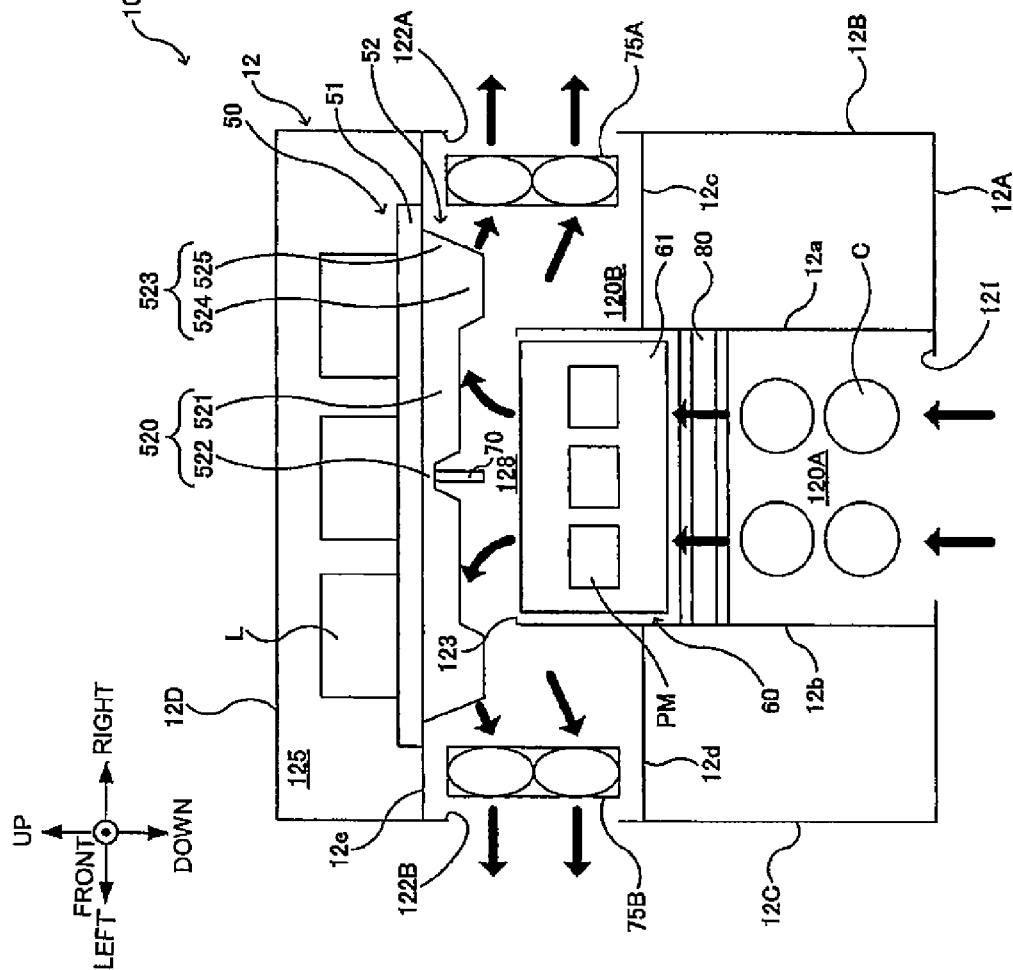

In addition, as illustrated in FIGS. 3 and 4B, a deflection member 80 which partially deflects a wind direction of the cooling air is installed between the fin 62 of the second heat sink 60 and the intake port 121 in the first duct 120A, that is, in a lower side of the fin 62. The deflection member 80 is formed by bending, for example, a plate member at two points, and includes a first plate portion 81 extending along the vertical direction, a second plate portion 82 extending from the first plate portion 81 to be inclined obliquely forward, and a third plate portion 83 extending along the vertical direction. The first plate portion 81 is fixed to the bottom plate 12E by, for example, welding or the like. According to such a configuration, the deflection member 80 partially deflects the wind direction of the cooling air, from the rear side of the capacitor C arranged as illustrated in FIG. 4B, forwardly.

Incidentally, the structure of the deflection member 80 is not limited to the above description. In addition, in a case where there is no need to deflect the wind direction of the cooling air, or the like, the deflection member 80 may not be installed inside the first duct 120A. In addition, the deflection direction of the wind direction of the cooling air caused by the deflection member 80 may be appropriately changed in accordance with an arrangement aspect or the like of the heat generating component and the heat sink inside the first duct 120A.

(2-2-5. Capacitor)

In addition, the capacitor C as an example of a second heat generating component which generates heat at the time of energization is installed in the housing 11 such that at least a part thereof is positioned inside the first duct 120A. Incidentally, any heat generating component which generates heat at the time of energization may be employed as the heat generating component to be installed inside the first duct 120A, and there is no particular limit in terms of types, number, or the like. However, in the embodiment, a description will be made regarding a case where, for example, four cylindrical capacitors C are installed. The capacitor C is covered by the capacitor cover, and is installed such that one end portion at which a terminal is arranged is positioned inside the main body case 13, and the other portion is positioned inside the first duct 120A. To be more specific, the capacitor C is installed at an upstream side in the flow direction of the cooling air than the second heat sink 60 in the first duct 120A, that is, at the lower side than the second heat sink 60. Incidentally, the capacitor C may be installed at a downstream side in the flow direction of the cooling air than the second heat sink 60 in the first duct 120A, that is, at the upper side than the second heat sink 60.

(2-2-6. Arrangement Order of Heat Generating Component)

Here, a description will be made regarding one example of relationship of heat resistance temperature and heat generation amount among the power module PM, the reactor L and the capacitor C. In other words, the heat resistance temperature increases in order of the reactor L, the power module PM and the capacitor C among the power module PM, the reactor L and the capacitor C. In addition, the heat generation amount increases in order of the power module PM, the reactor L and the capacitor C among the power module PM, the reactor L and the capacitor C.

In the embodiment, as described above, the second heat sink 60 on which the power module PM is installed is installed in the first duct 120A, and further, the capacitor C is installed at the upstream side in the flow direction of the cooling air than the second heat sink 60. Further, the first heat sink 50 on which the reactor L is installed is installed in the second duct 120B. In other words, the power module PM, the reactor L and the capacitor C are arranged in order from a component having the lower heat resistance temperature, that is, in order of the capacitor C, the power module PM and the reactor L, from the upstream side toward the downstream side in the flow direction of the cooling air. Incidentally, the order of arrangement among the power module PM, the reactor L and the capacitor C is not limited to the order from the component having the lower heat resistance temperature from the upstream side toward the downstream side in the flow direction of the cooling air. It may be arranged in order from a component having greater heat generation amount, or the like from the upstream side toward the downstream side in the flow direction of the cooling air.

Incidentally, the arrangement configuration of each constituent element of the inverter 10 described above is merely an example, and another arrangement configuration may be employed.

<3. Effect According to Embodiment>

As described above, the main body 10A housing a plurality of the electronic components is arranged at the front side of the housing base 11a in the inverter 10 according to the embodiment. In addition, the first duct 120A is arranged at the rear side of the housing base 11a, and further, the first heat sink 50 is installed such that the plate surface direction of the heat sink base 51 on which the reactor L is installed is perpendicular to the extension direction of the first duct 120A. Accordingly, it is possible to partition the main body 10A housing the plurality of electronic components and the air duct portion 10B in which the reactor L is arranged by the housing base 11a, and accordingly, it is possible to protect the electronic component from heat of the reactor L. In addition, according to the above-described configuration, it is possible to allow the cooling air sucked in by the intake port 121 and flowing in the first duct 120A to hit the first heat sink 50 along the direction perpendicular to the plate surface direction of the heat sink base 51. Accordingly, it is possible to improve the cooling efficiency in the reactor L compared to a case, for example, where the cooling air is caused to flow along a direction parallel to the plate surface direction with respect to the first heat sink 50.

In addition, in the embodiment, in particular, the second heat sink 60 is installed in the first duct 120A such that the plate surface direction of the heat sink base 61 is parallel to the extension direction of the first duct 120A, and the fin 62 is positioned inside the first duct 120A. Accordingly, it is possible to cool the power module PM as the heat generating component different from the reactor L using the second heat sink 60 at the upstream side of the first heat sink 50. In this manner, it is possible to effectively utilize the cooling air flowing in the first duct 120A without loss so that it is possible to further improve the cooling efficiency.

In addition, in the embodiment, in particular, the second duct 120B is arranged at the rear side of the housing base 11a, which extends in the direction inclined with respect to the extension direction of the first duct 120A, and further, is connected to the second end of the first duct 120A, and both the ends thereof are connected to the exhaust ports 122A and 122B. Further, the first heat sink 50 is installed in the vicinity of the connection portion 128 such that the fin 52 is positioned inside the second duct 120B and the reactor L is positioned outside the second duct 120B. Accordingly, it is possible to arrange the first heat sink 50 at the position to deflect the wind direction of the cooling air in the connection portion 128 between the first duct 120A and the second duct 120B so that it is possible to improve the cooling efficiency of the reactor L.

In addition, according to the above-described configuration, it is possible to partition the housing space 125 as an installment space of the reactor L, and the second duct 120B as an air flow space of the cooling air so that it is possible to protect the reactor L from outside air. To be more specific, in a case where the inverter 10 is installed near coast for example, it is possible to suppress corrosion of the reactor L due to the outside air containing a lot of salt. In addition, the reactor L is the heat generating component having relatively a great heat generation amount, but its thermal conductivity to the first heat sink 50 is low as compared to the power module PM. Thus, the first heat sink 50 is caused to be hit by the cooling air from the direction perpendicular to the plate surface direction of the heat sink base 51 as described above so as to improve the cooling efficiency. Meanwhile, the reactor L is hermetically housed in the housing space 125 at the rear side of the housing base 11$a$ since its heat resistance temperature is relatively high, and accordingly, it is possible to protect the electronic component from heat of the reactor L.

In addition, in the embodiment, in particular, the plurality of fins 52 projecting from the heat sink base 51 in the extension direction of the first duct 120A includes the portion 524, which has the projection height higher than that of the portion 520 corresponding to the opening 123 of the first duct 120A, at the portion 523 corresponding to the outer side of the opening 123. Accordingly, the cooling air is suppressed from generating turbulence at the portion hitting the first heat sink 50 so that it is possible to allow a smooth deflection of the wind direction, thereby suppressing reduction in the airflow.

In addition, in the embodiment, in particular, the partition plate 70, of which the plate surface direction is perpendicular to the plate surface direction of the fin 52, is installed such that the opening 123 of the first duct 120A is divided into two parts in the second duct 120B. Accordingly, it is possible to promote the cooling air to be branched at the portion where the cooling air hits the first heat sink 50 so that it is possible to suppress the generation of turbulence and reduction in the airflow.

In addition, in the embodiment, in particular, the plurality of fins 52 are formed such that the portion 522 corresponding to the partition plate 70 has the projection height lower than that of the other portion 521 at the portion 520 corresponding to the opening 123 of the first duct 120A. Accordingly, it is possible to install the partition plate 70 so as to overlap with the fin 52 in the projecting direction of the fin 52 so that it is possible to downsize a dimension in the extension direction of the first duct 120A of the inverter 10.

In addition, in the embodiment, in particular, the exhaust fans 75A and 75B, which discharge the cooling air, are installed in the vicinity of the exhaust ports 122A and 122B. Accordingly, it is possible to suppress the turbulence generated when the cooling air hits the heat sinks 50 and 60, the capacitor C, and the like, and to suppress the reduction in the airflow as compared to a case, for example, where a suction fan is installed in the intake port 121.

In addition, in the embodiment, in particular, the reactor L, the capacitor C and the power module PM are arranged in order from the component having the lower heat resistance temperature, from the upstream side toward the downstream side in the flow direction of the cooling air. In other words, since the heat resistance temperature affects service life of a component (in particular, a component such as the capacitor C has relatively a low heat resistance temperature, and thus, a use temperature greatly affects the service life of the component), the component having the lower heat resistance temperature is arranged at the more upstream side where a heat radiation amount is great (cooling performance is high). Accordingly, it is possible to use the heat generating component at the heat resistance temperature or lower, and thus, it is possible to increase the service life of the component (in this example, in particular, the service life of the capacitor C).

In addition, in the embodiment, in particular, the deflection member 80 which partially deflects the wind direction of the cooling air is installed to the intake port 121 side of the fin 62 of the second heat sink 60, in the first duct 120A. Accordingly, it is possible to cause the cooling air to focusedly hit the fin 62 of the second heat sink 60 positioned at the downstream side of the deflection member 80 so that it is possible to further improve the cooling efficiency. In particular, the cooling air flowing in a gap at the rear side of the capacitor C is likely to flow into a gap at the rear side of the second heat sink 60 as it is. However, since the cooling air in such a state hardly contributes to the cooling, it is possible to effectively utilize the cooling air by installing the deflection member 80 to the bottom plate 12E side.

In addition, in the embodiment, in particular, the second heat sink 60 on which the capacitor C and the power module PM are installed in order from the upstream side in the flow direction of the cooling air is installed in the first duct 120A. Accordingly, it is possible to increase the service life of the capacitor C, and to effectively cool the power module PM having the greatest heat generation amount using the second heat sink 60.

<4. Modification and the Like>

Incidentally, the embodiment is not limited to the above-described content, and various types of modification may be possible in a range not departing from the gist of the invention and technical ideas. Hereinafter, such modifications will be described in order.

(4-1. Case where Capacitor is Cooled by Heat Sink)

Although the description has been made exemplifying the case where a part of the capacitor C is housed in the duct case 12 and is cooled directly by the cooling air in the above-described embodiment, the capacitor C may be housed in the main body case 13 and cooled using the heat sink.

Figure 5B:
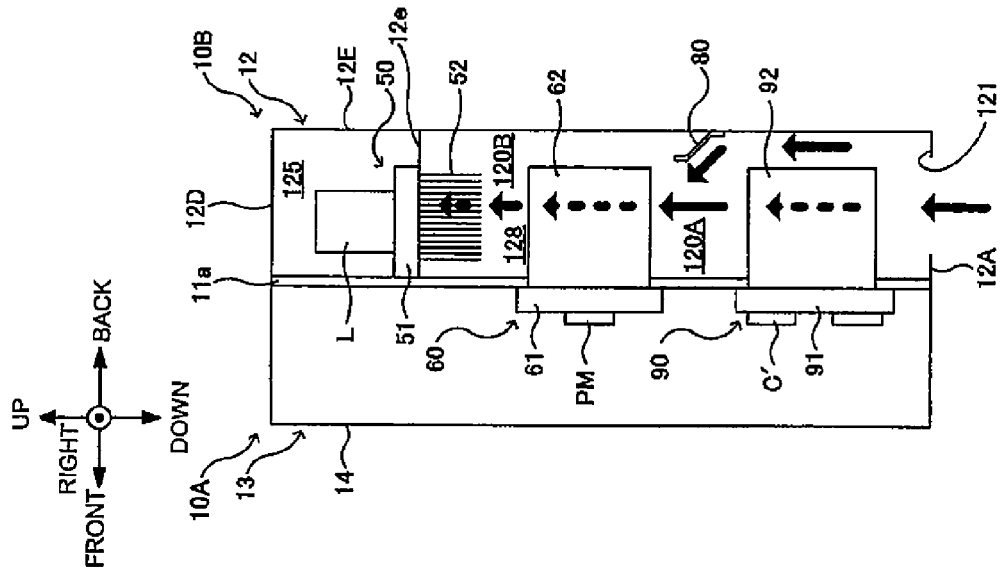
FIGS. 5A and 5B are a plan view and a side cross-sectional view schematically illustrating an example of arrangement configuration of each constituent element of an inverter according to a modification in which a capacitor is cooled by a heat sink.
Figure 5A:
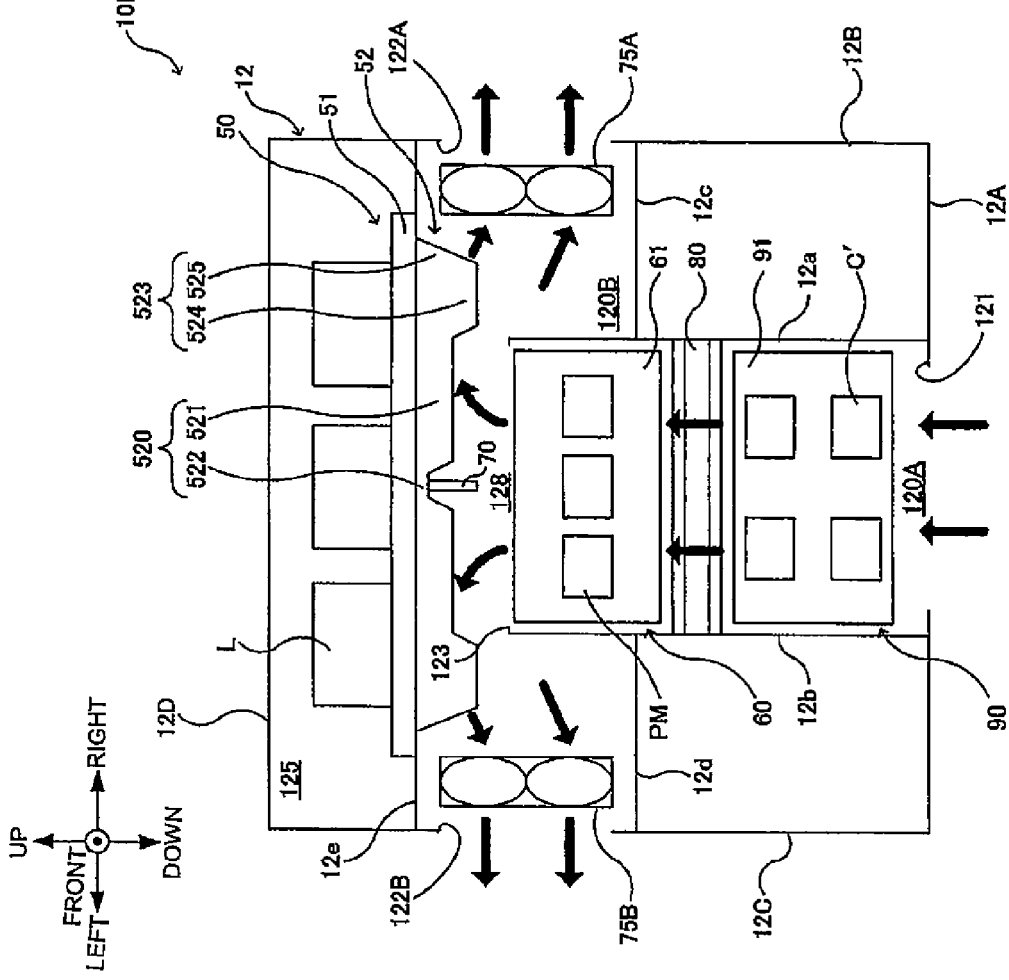

As illustrated in FIGS. 5A and 5B, in this modification, a heat sink 90 (hereinafter, referred to as a "second heat sink 90") as an example of the second heat sink is installed at the upstream side in the flow direction of the cooling air than the second heat sink 60, in the first duct 120A, that is, at the lower side than the second heat sink 60.

The second heat sink 90 includes a heat sink base 91 as an example of a second heat sink base, and a plurality of fins 92 as an example of the second fin. The fin 92 projects from a surface of the one side of the heat sink base 91 in a direction perpendicular to the plate surface direction thereof. For example, four capacitors C' having, for example, a flat plate shape are installed on the surface of the another side of the heat sink base 91 so as to be positioned inside the main body case 13. Further, the second heat sink 90 is installed to a lower side than the second heat sink 60 in the first duct 120A such that the plurality of fins 92 is positioned inside the first duct 120A, the heat sink base 91 in which the capacitor C' is installed blocks an opening (not illustrated) of the housing base 11$a$, and further the plate surface direction of the heat sink base 91 is perpendicular to the longitudinal direction. At this time, the plate surface direction of the plurality of fins 92 is perpendicular to the lateral direction.

In this modification, it is possible to obtain the same effect as in the above-described embodiment.

(4-2. Case where Power Module is Installed in First Heat Sink 50)

Although the description has been made regarding the case where the inverter 10 as the power conversion apparatus includes the reactor L in the above-described embodiment, a power conversion apparatus without the reactor L may be considered. In such a case, the power module PM may be installed on the first heat sink 50 instead of the reactor L.

As illustrated in FIGS. 6A and 6B, in this modification, for example, three power modules PM are installed on the heat sink base 51 of the first heat sink 50 and arranged inside the housing space 125. In other words, in this modification, the power module PM is not housed in the main body case 13, the second heat sink 60 is not installed in the first duct 120A, and further the power module PM, instead of the reactor L, is arranged in the housing space 125 differently from the above-described embodiment.

It is possible to obtain the same effect as in the above-described embodiment also in this modification.

(4-3. Case where Duct has Substantially L Shape in Plan View)

Although the description has been made exemplifying the case where the duct 120 has substantially a T shape in the plan view as a whole in the above-described embodiment, a duct may have substantially an L shape in the plan view as a whole.

Figure 7B:
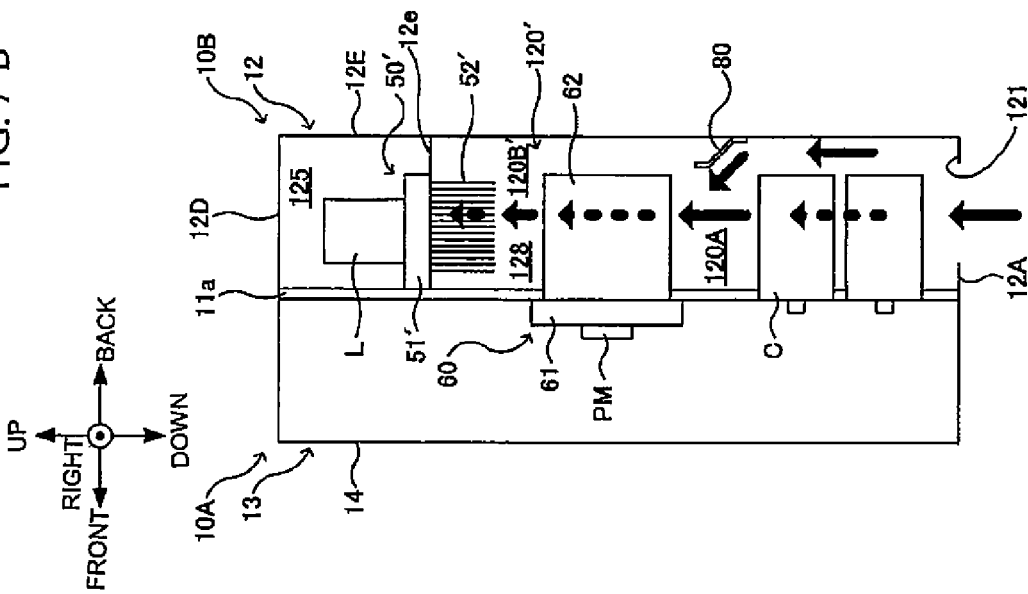
FIGS. 7A and 7B are a plan view and a side cross-sectional view schematically illustrating an example of arrangement configuration of each constituent element of an inverter according to a modification in which a duct has substantially an L shape in the plan view.
Figure 7A:
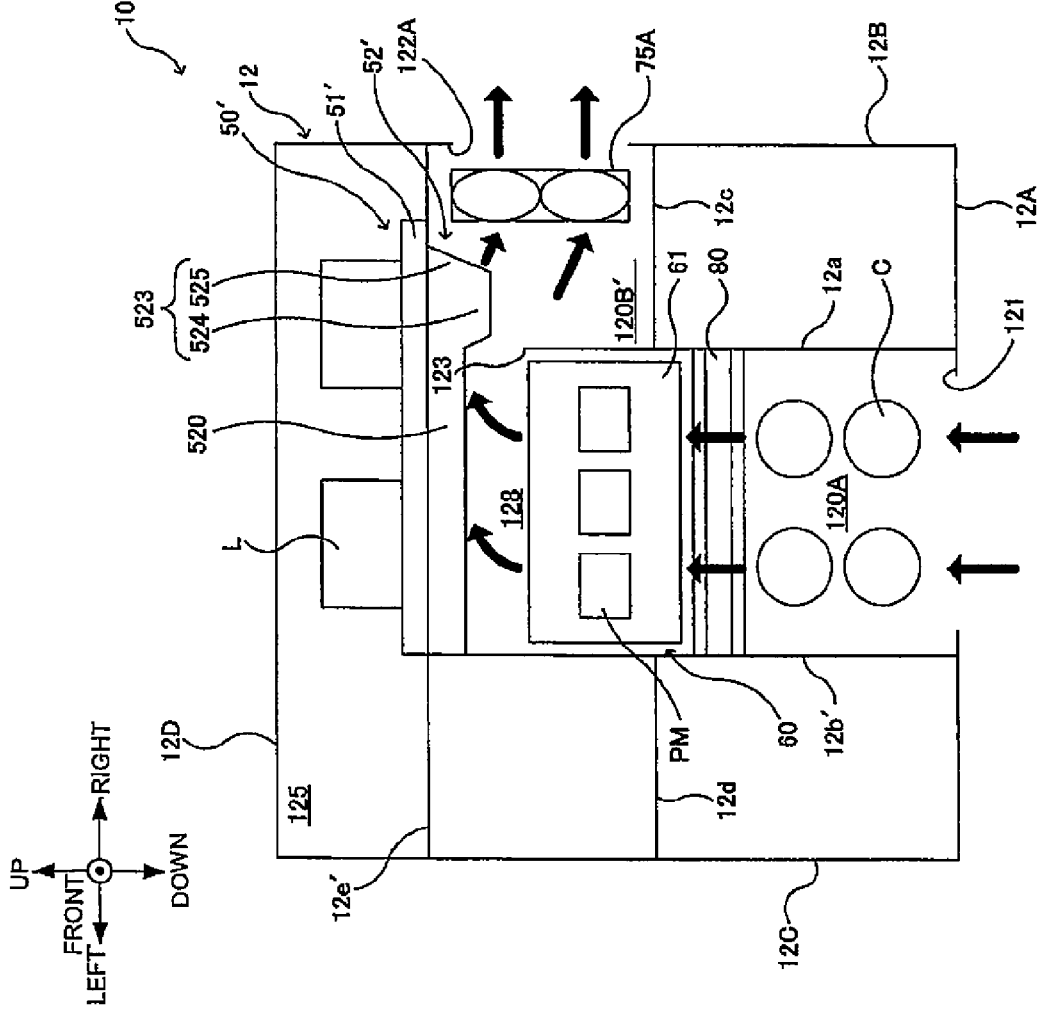

As illustrated in FIGS. 7A and 7B, in this modification, differently from the above-described embodiment, the intake port 121 and the exhaust port 122A are formed in the duct case 12, and the exhaust port 122B is not formed. In addition, the exhaust fan 75B is not installed either.

Further, a second duct 120B' is connected to the second end of the first duct 120A such that the second end of the first duct 120A is positioned at a left end side thereof. A duct 120' has substantially an L shape in the plan view as a whole. The second duct 120B' is configured by a part of the housing base 11a, a part of the bottom plate 12E, and the partition walls 12c and 12e' arranged therebetween, and an end (in this example, a right end) thereof is opened. Further, the right end of the second duct 120B' is connected to the exhaust port 122A, and the left end thereof is blocked. Further, the first heat sink 50' is installed on an upper surface of the partition wall 12e' such that a plurality of fins 52' as an example of the first fin is positioned inside the second duct 120B', a heat sink base 51' as an example of the first heat sink base in which, for example, two reactors L are installed blocks an opening (not illustrated) of the partition wall 12e'.

It is possible to obtain the same effect as in the above-described embodiment also in this modification.

(4-4. Others)

Incidentally, although the description has been made regarding the case in which the air duct of the duct case 12 is formed by two ducts such as the first duct 120A and the second duct 120B in the above description, the air duct of the duct case 12 may be formed by one duct.

Incidentally, although the description of "perpendicular", "parallel", "planer" or the like is present in the above description, such a description does not have a strict meaning. In other words, tolerance or error in design or manufacture is allowed for such a description of "perpendicular", "parallel" and "planer" so as to have the meaning of "practically perpendicular", "practically parallel" and "practically planer".

In addition, although the description of "the same", "equal", "different" or the like is present in relation to a dimension or a size on the appearance in the above description, such a description does not have a strict meaning. In other words, tolerance or error in design or manufacture is allowed for such a description of "the same", "equal" and "different" so as to have the meaning of "practically the same", "practically equal" and "practically different".

In addition, other than the above-described technique, the techniques according to the above-described embodiment and each modification may be appropriately combined to be utilized.

Furthermore, although each example is not provided, the above-described embodiment and each modification may be realized by being added with various types of change within a range not departing from the spirit.

What is claimed is:

1. A power conversion apparatus comprising:
    a housing base which includes a first area and a second area opposite to the first area;
    a main body which is arranged in the first area of the housing base and houses a plurality of electronic components forming a power conversion circuit;
    a first duct which is arranged in the second area of the housing base and includes a first end connected to an intake port of cooling air;
    a first heat sink which is arranged in the second area of the housing base and includes a first fin and a first heat sink base extending perpendicular to an extension direction of the first duct;
    a first heat generating component which is installed on the first heat sink base in the second area of the housing base, and generates heat at the time of energization;
    a second heat generating component which generates heat at the time of energization, at least a part of the second heat generating component being positioned inside the first area; and
    a third heat generating component which is installed on the housing base in the main body, and generates heat at the time of energization,
    wherein the first heat generating component, the second heat generating component and the third heat generating component are arranged in order from the component having a lower heat resistance temperature, from an upstream side toward a downstream side in a flow direction of the cooling air.

2. The power conversion apparatus according to claim 1, further comprising:
    a second heat sink which is arranged in the first duct and includes a second heat sink base extending parallel to the extension direction of the first duct and a second fin positioned inside the first duct.

3. The power conversion apparatus according to claim 2, further comprising:
    a second duct which extends in a direction inclined with respect to the extension direction of the first duct and is connected to a second end of the first duct in the second area of the housing base; wherein
    the second duct includes a first end and a second end being a different end from the first end of the second duct;
    the first end of the second duct or both the first end and the second end of the second duct are connected to an exhaust port of the cooling air;
    the first heat sink is arranged in a vicinity of a connection portion between the second duct and the first duct;
    the first fin is positioned inside the second duct; and
    the first heat generating component is positioned outside the second duct.

4. The power conversion apparatus according to claim 3, wherein the first heat sink includes a plurality of the first fins projecting from the first heat sink base in the extension direction of the first duct, and
    the plurality of first fins includes a portion having a projection height higher than a projection height of a portion corresponding to an opening at the second end of the first duct in a portion corresponding to an outer side of the opening.

5. The power conversion apparatus according to claim 4, wherein the plurality of first fins includes a portion having a projection height lower than a projection height of other portion in the portion corresponding to the opening of the first duct.

6. The power conversion apparatus according to claim 4, further comprising:
a partition plate which is arranged in the second duct having the exhaust port at both ends, wherein
the partition plate divides the opening of the first duct into two parts; and
the partition plate extends perpendicular to an extension direction of the first fin.

7. The power conversion apparatus according to claim 5, further comprising:
a partition plate which is arranged in the second duct having the exhaust port at both ends, wherein
the partition plate divides the opening of the first duct into two parts; and
the partition plate extends perpendicular to an extension direction of the first fin.

8. The power conversion apparatus according to claim 6, wherein the plurality of first fins has a portion corresponding to the partition plate having a projection height lower than a projection height of other portions in the portion corresponding to the opening of the first duct.

9. The power conversion apparatus according to claim 7, wherein the plurality of first fins has a portion corresponding to the partition plate having a projection height lower than a projection height of other portions in the portion corresponding to the opening of the first duct.

10. The power conversion apparatus according to claim 3, further comprising:
an exhaust fan which is arranged in a vicinity of the exhaust port, and configured to discharge the cooling air.

11. The power conversion apparatus according to claim 2, further comprising:
a deflection member which is arranged between the second fin of the second heat sink and the intake port inside the first duct, and partially deflects a wind direction of the cooling air.

12. The power conversion apparatus according to claim 2, wherein the second heat sink in which a capacitor as the second heat generating component and a power module as the third heat generating component are arranged in order from the upstream side in the flow direction of the cooling air is arranged in the first duct.

13. The power conversion apparatus according to claim 11, wherein the second heat sink in which a capacitor as the second heat generating component and a power module as the third heat generating component are arranged in order from the upstream side in the flow direction of the cooling air is arranged in the first duct.

14. The power conversion apparatus according to claim 1, wherein the first heat generating component is a coil-shaped component.

15. The power conversion apparatus according to claim 14, wherein the first heat generating component is a reactor.

16. A power conversion apparatus comprising:
a housing base which includes a first area and a second area opposite to the first area;
a main body which is arranged in the first area of the housing base and houses a plurality of electronic components forming a power conversion circuit;
a duct which is arranged in the second area of the housing base and includes an end connected to an intake port of cooling air;
a first heat sink which is arranged in the second area of the housing base and includes a heat sink base;
a heat generating component which is installed on the heat sink base in the second area of the housing base, and generates heat at the time of energization;
means for making the cooling air contact with the heat sink along a direction perpendicular to a direction to which the heat sink base extends;
a second heat generating component which generates heat at the time of energization, at least a part of the second heat generating component being positioned inside the first area; and
a third heat generating component which is installed on the housing base in the main body, and generates heat at the time of energization,
wherein the first heat generating component, the second heat generating component and the third heat generating component are arranged in order from the component having a lower heat resistance temperature, from an upstream side toward a downstream side in a flow direction of the cooling air.

* * * * *